United States Patent
Tsang et al.

(10) Patent No.: US 6,727,736 B1
(45) Date of Patent: Apr. 27, 2004

(54) VOLTAGE CONTROL OSCILLATOR NOISE REDUCTION TECHNIQUE AND METHOD THEREOF

(75) Inventors: Randy Tsang, Foster City, CA (US); Shuran Wei, San Jose, CA (US)

(73) Assignee: Marvell International, Ltd., Hamilton (BM)

( * ) Notice: Subject to any disclaimer, the term of this patent is extended or adjusted under 35 U.S.C. 154(b) by 0 days.

(21) Appl. No.: 10/226,549

(22) Filed: Aug. 23, 2002

(51) Int. Cl.[7] ............................................... H03L 4/06
(52) U.S. Cl. ........................................ 327/157; 327/156
(58) Field of Search ........................... 327/553, 558, 327/156, 157, 362

(56) References Cited

U.S. PATENT DOCUMENTS

| | | | |
|---|---|---|---|
| 4,816,770 A | * | 3/1989 | Nauman .................... 329/122 |
| 5,548,829 A | * | 8/1996 | Suzuki et al. ............ 455/180.3 |
| 5,677,648 A | | 10/1997 | Jones ........................... 331/17 |
| 6,111,470 A | | 8/2000 | Dufour ......................... 331/17 |
| 6,141,394 A | | 10/2000 | Linebarger et al. ......... 375/376 |
| 6,188,287 B1 | * | 2/2001 | Avanic et al. ................ 331/11 |
| 6,198,320 B1 | | 3/2001 | Boerstler .................... 327/157 |
| 6,320,435 B1 | | 11/2001 | Tanimoto .................... 327/156 |

OTHER PUBLICATIONS

Craninckx, J. and Steyaert, M., "A 1.8 GHz Low–Phase––Noise CMOS VCO Using Optimized Hollow Spiral Inductors", May 1997, IEEE Journal of Solid–State Circuits, vol. 32, No. 5.

Craninckx, J. and Steyaert, M., "A 1.8 GHz CMOS Low––Phase–Noise Voltage–Controlled Oscillator with Prescaler," Dec., 1995, IEEE Journal of Solid–State Circuits, vol. 30, No. 12.

\* cited by examiner

*Primary Examiner*—Timothy P. Callahan

(57) ABSTRACT

A phase locked loop including a loop filter to generate a control voltage as a function of an input signal and a reference voltage. A voltage controlled oscillator (VCO) coupled to the loop filter, includes a varactor having terminals. In response to the control voltage, the VCO generates a periodic output signal having a frequency that is a function of the varactor and the control voltage. The VCO duplicates noise appearing on one of the varactor terminals to another of the varactor terminals so that noise in the periodic output signal is reduced.

43 Claims, 4 Drawing Sheets

VOLTAGE CONTROL OSCILLATOR NOISE REDUCTION TECHNIQUE AND METHOD THEREOF

TECHNICAL FIELD

An aspect of this invention relates to voltage controlled oscillators.

BACKGROUND

A Phase Locked Loop (PLL) is typically employed to generate timing signals, clock signals or carrier frequencies in communication systems and for timing recovery in receiving systems. FIGS. 1A and 1B show conventional PLLs 200 and 240. The PLLs 200 and 240 employ an active loop filter 202 and a passive loop filter 242 respectively. One of the key performance parameters of a PLL is "phase noise". A large amount of phase noise may introduce timing variance and hence affect system performance. Therefore, minimizing the phase noise of a PLL is typically one of the design goals of a transceiver in a communication system.

There are many sources within a PLL system that can contribute to phase noise. In fact, every building block in a PLL contributes to phase noise in various degrees. Key contributors of phase noise include the Voltage Control Oscillator (VCO) and the associated circuits that generate the VCO control voltage such as the PLL loop filter. Charge pump based PLLs can be implemented with either an active or a passive filter. High-Q resonator based VCO's are usually the topology of choice in applications that require low phase noise.

First, referring to FIG. 1C, consider the noise contribution from a VCO 280. We would initially assume that the VCO control voltage, VCTRL, is ideal and noise free. In an LC resonator based VCO such as VCO 280, the current source 282 and cross-coupled transistors 284 and 286 are the dominant VCO phase noise contributors. In particular, it MOSFET devices are used in the VCO implementation, the 1/f noise of these devices could increase the phase noise of the VCO significantly (by 2 to 6 dB). The noise contribution of, for example, the cross-coupled pair 284 and 286 and the current source 282 may translate into an equivalent noise voltage imposed across the varactor 288. This noise voltage modulates the effective value of the varactor capacitance 288 and hence may cause the VCO oscillating frequencies to change.

In addition to the contribution of PLL phase noise from the VCO 280, an active loop filter 202, as in PLL 200, can also contribute to the total PLL phase noise. Conventional PLL active filters include a positive input to which a bias voltage, Bias, is applied. The bias voltage generally has a fluctuating component and this disturbance will appear at the output of the opamp that is connected to the VCO control node. As a result, the voltage fluctuation or noise associated with the reference voltage will be impressed across the varactor of the VCO. This causes a fluctuation in the varactor capacitance value and results in a random modulation of the VCO oscillating frequency. The fluctuation in frequency may manifest itself as excessive phase noise.

SUMMARY

A phase locked loop including a loop filter to generate a control voltage as a function of an input signal and a reference voltage. A voltage controlled oscillator a(VCO) coupled to the loop filter, includes a varactor having terminals. In response to the control voltage, the VCO generates a periodic output signal having a frequency that is a function of the varactor and the control voltage. This PLL configuration duplicates noise appearing on one of the varactor terminals to another of the varactor terminals so that noise in the periodic output signal is reduced.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1A:
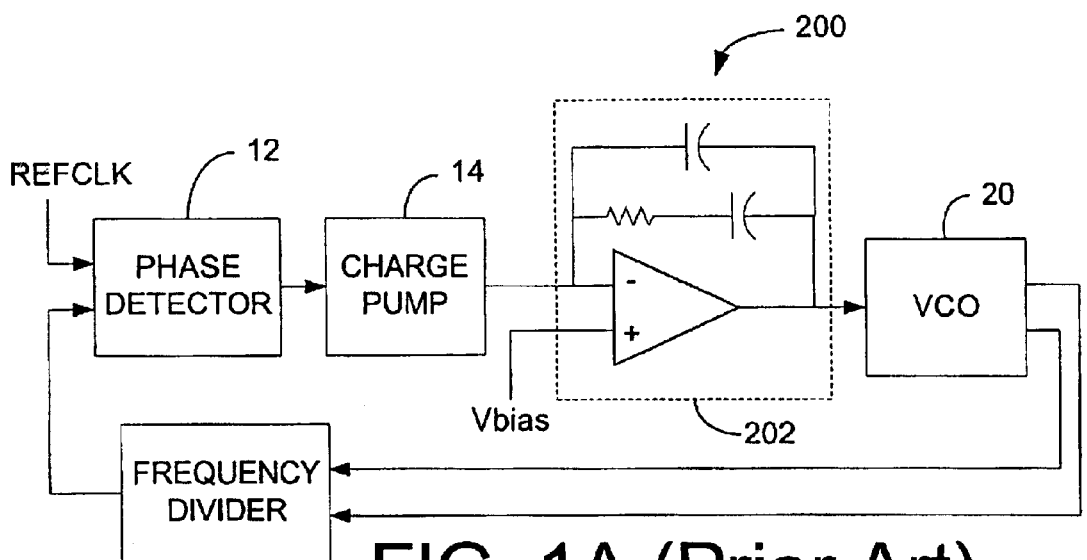
FIG. 1A is a block diagram of a conventional PLL having an active loop filter.
Figure 1B:
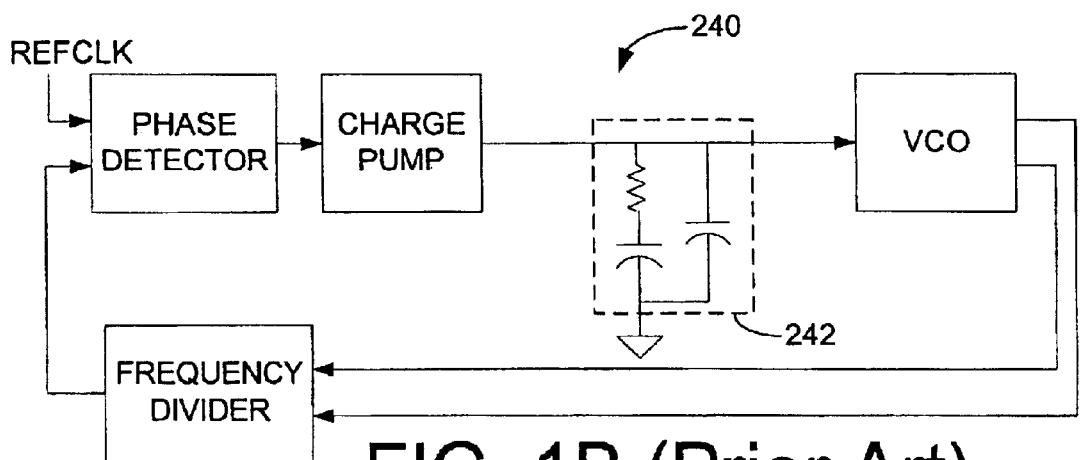
FIG. 1B is a block diagram of a conventional PLL having a passive loop filter.
Figure 1C:
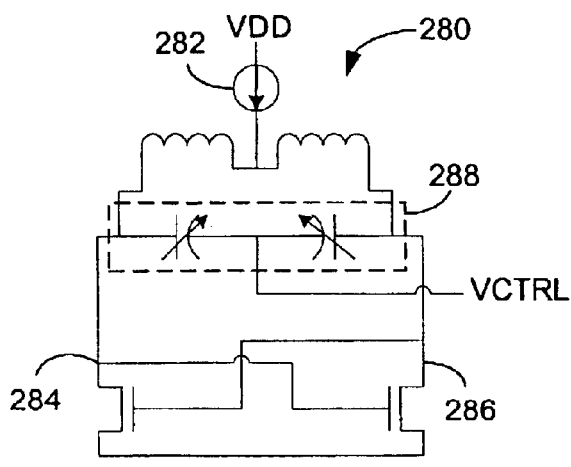
FIG. 1C is a detailed schematic of a conventional VCO.
Figure 2:
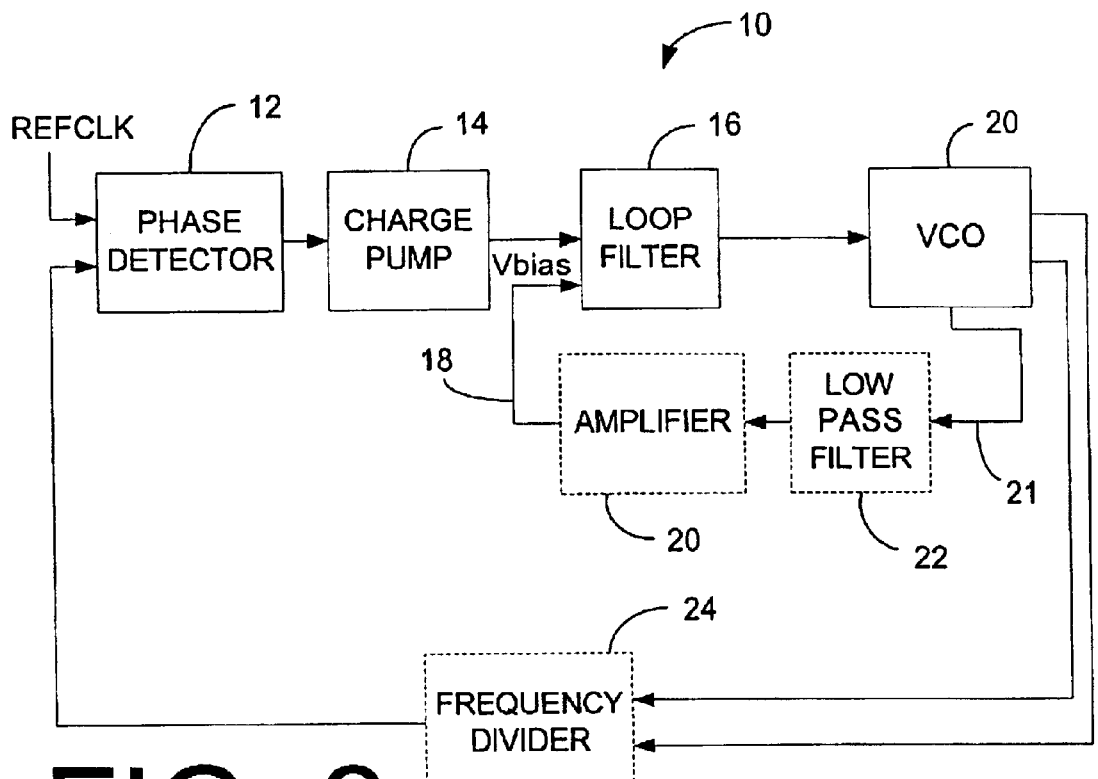
FIG. 2 is a block diagram of an aspect of a PLL.

FIG. 2 shows a PLL 10 for generating a controlled signal having a periodic waveform. The PLL 10 advantageously reduces phase noise performance degradation. The phase noise may be due to the noise generated by sources such as the various circuit elements in the VCO and the loop filter. One aspect of the PLL 10 eliminates or reduces the random voltage appearing across the varactor in the VCO by duplicating the noise at one terminal of the varactor to its other terminal. In doing so, the random voltage appearing across the varactor is eliminated or reduced. In another aspect of the PLL 10, the noise contribution from the bias voltage may be eliminated.

A phase detector 12 compares a reference clock signal to a feedback clock signal and generates an error signal based upon the comparison. The phase detector 12 may be any type of analog, digital, or mixed signal device that compares one clock signal to another clock signal and generates an error signal based on the comparison. The error signal preferably comprises an up signal and a down signal in which the pulse width of the up and down signals indicates the magnitude of the phase error. However, other signal types may be employed for the error signal such as analog signals, tri-level signals, and digital signals having other signal formats.

A charge pump 14 converts the error signal from the phase detector 12 into a charge pump output signal. The charge pump 14 may be any type of charge pump including analog, digital, and mixed signal.

A loop filter 16 takes the charge pump output signal and generates a control signal, VCNTRL, to control a VCO 20. The loop filter may be any type of low pass circuit including passive and active filters, and digital as well as discrete filters.

The VCO 20 generates an output having a periodic waveform such as a sinusoid. The frequency of the periodic waveform may be controlled by varying the voltage level of VCNTRL. A feedback signal, VCO_FBK, 21 from the VCO 20 may be coupled to the loop filter reference input 18. The feedback bootstrapping action may reduce noise in the VCO 20 leading to improved performance of the PLL 10 including a reduction in phase noise. Potential noise sources that the feedback signal may mitigate include noise coupled onto the loop filter reference due to the bias voltage generator input and differential noise coupled to internal nodes of the VCO 20. Noise coupled onto the loop filter reference input of a, conventional PLL, generally passes through the loop filter without attenuation and is then added to the control signal and impressed on the VCO.

By coupling the feedback signal 21 to the loop filter reference input 18, circuitry that conventional devices require to generate the bias voltage signal may be eliminated. Also, differential-mode noise that appears across the frequency controlling element, such as the varactor, of the VCO can modulate the oscillation frequency and create excess phase noise. By coupling the VCO feedback signal to the loop filter reference input, the noise at one terminal of the varactors can pass through the loop filter to the control voltage signal. This effectively duplicates the noise onto the other terminal of the varactor. As a result, the noise appearing across the varactor is substantially reduced and this improves the phase noise performance.

In addition, by eliminating the circuitry that is generally required for generating the bias voltage, noise associated with that circuitry is eliminated.

A low pass filter 22 may be connected in series with the feedback signal 21 and the reference input 18 to attenuate preselected signal components above the natural frequency of the PLL. For example, the ripple of the feedback signal 21 at high frequencies above the PLL bandwidth may be attenuated to improve the operation of the VCO 20. Increasing the corner frequency of the low pass filter, increases the range of frequencies that appear as common-mode noise to the VCO 20 resulting in reduced phase noise between the VCO natural frequency and the low pass filter corner frequency. The low pass filter 22 may range from first order to any multiple order and may include mixed lead and lag configurations. In some implementations, an amplifier 20 may also be connected in series with the feedback signal 21 and the reference input 18 to amplify the feedback signal 21.

A frequency divider 24 may be included to sense the VCO output and generate a feedback clock signal having a frequency that is a divided multiple of the VCO output.

Figure 3:
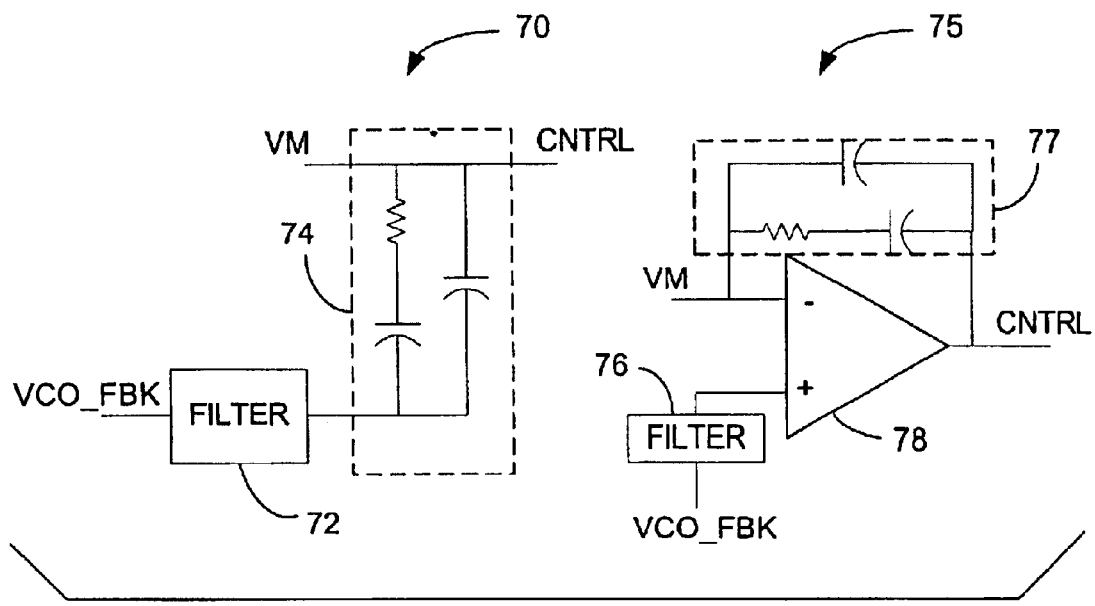
FIG. 3 is a schematic diagram of a loop filter.

FIG. 3 shows an aspect of several loop filters that may be employed in the PLL 10. A passive loop filter 70 includes a low pass filter 72 coupled to a VCO feedback signal, VCO_FBK, and a compensation network 74 coupled to a charge pump output, VM. A control voltage, VCNTRL, controls the waveform frequency of the VCO output.

An active loop filter 75 may include a low pass filter 76 coupled between a VCO feedback signal, VCO_FBK, and the non-inverting input of an amplifier 77. A compensation network 78 may be coupled between the inverting input and the output of the amplifier. A charge pump output, VM, may be coupled to the negative input. The output of the amplifier 77 generates a control voltage, VCNTRL, to control the waveform frequency of the VCO output.

Figure 4:
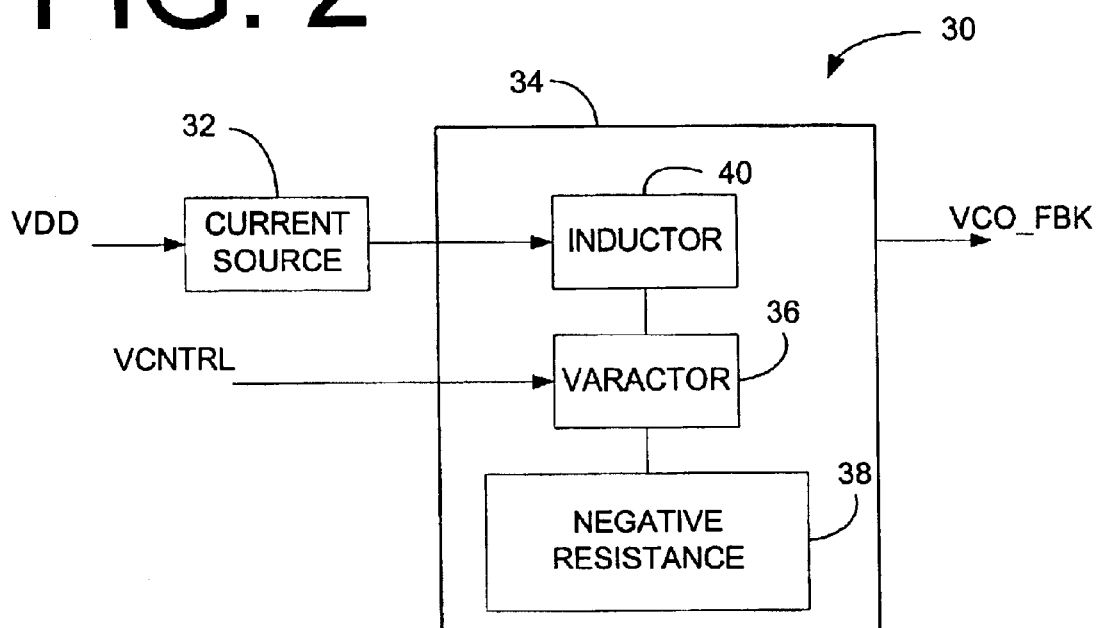
FIG. 4 is a block diagram of an aspect of a VCO.

FIG. 4 shows a VCO 30 for generating an output having a periodic waveform. The VCO 30 may include a current source 32 connected to a resonant circuit 34 to generate the output. The resonant circuit 34 may include a parallel combination of an inductor 40 and a varactor 36 coupled across an equivalent negative resistance circuit 38 such as a pair of cross-coupled switches. The inductor 40 preferably includes a center-tap to receive energy from the current source 32. The varactor 36 may be any type of capacitor that is variable in response to a control signal. A feedback signal is tapped off of the resonant circuit 34 and coupled to the reference input. of a loop filter. The feedback signal is preferably derived. from a center-tap of the inductor, however one or more nodes within the resonant circuit may be used in combination or alone as the source for the feedback signal.

Figure 5:
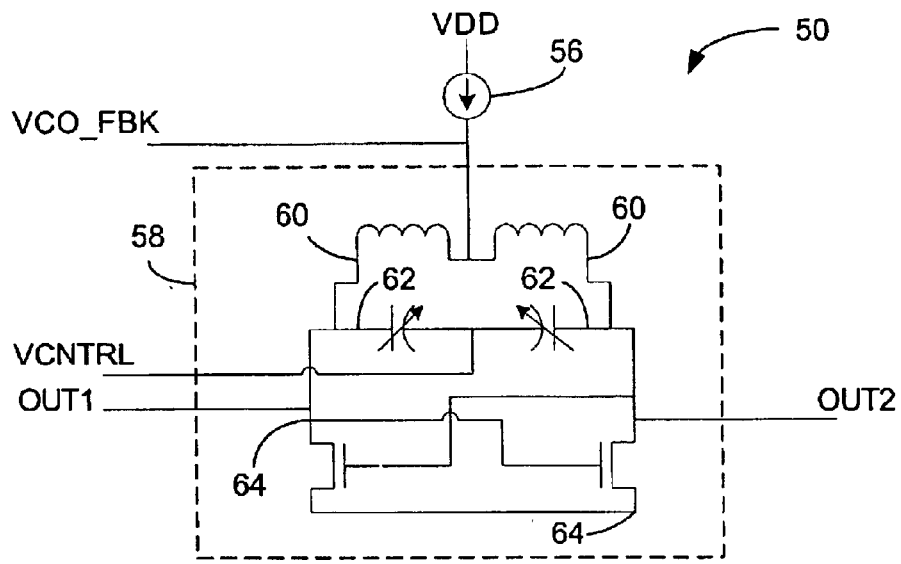
FIG. 5 is a schematic diagram of an aspect of a VCO.

FIG. 5 shows a detailed schematic of an aspect of a VCO 50 for generating an output having a controllable, periodic waveform. A current source supplies energy to a resonant circuit 58 comprising a center-tapped inductor 60, a pair of varactors 62, and a pair of cross-coupled switches 64. A control voltage, VCNTRL, may be impressed on the common node between the varactors 62 to control the frequency of the periodic waveform that is generated. A feedback signal, VCO_FBK, may sample the voltage at the center-tap of the inductor 60. Outputs, OUT1 and OUT2, may be obtained from the drains of the cross-coupled switches 64.

In operation, the positive feedback action of the cross-coupled switches 64 behaves as a negative resistor over a voltage range which delivers the correct amount of energy over each cycle to compensate for losses in the LC tank circuit. Hence, allowing the energy to continuously transfer between the inductors and capacitors of the tank circuit. A detailed description of the VCO operation is provided by J. Crahinckx and M. Steyart in 1.8 *GHz low-phase noise CMOS VCO using optimized hollow spiral inductors*, IEEE J. Solid-State Circuits, vol. 32, pp. 736–744, May 1997, which is hereby incorporated by reference.

By coupling VCO_FBK to the non-inverting input of the loop filter, noise that appears at the output of the current source 56 also appears on the VCNTRL signal, effectively converting differential-mode noise across the varactor to common-mode noise. This reduces the voltage fluctuation across the varactor and reduces the amount of phase noise the VCO produces.

Figure 6:
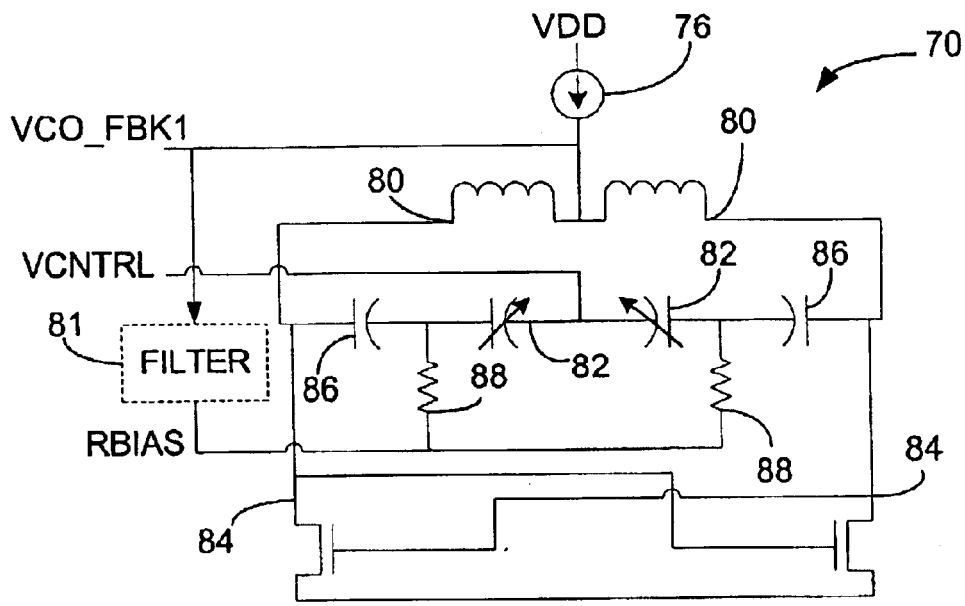
FIG. 6 a schematic diagram of another aspect of a VCO

FIG. 6 shows another aspect of a VCO 80 similar in function to VCO 50 with corresponding elements 76–84, except for additional fixed capacitors 86 and resistors 88. The same noise reduction technique can be applied to this VCO configuration as well. In addition to taking VCO_FBK1 to the positive bias input of the opamp in the loop filter, one can bootstrap RBIAS from VCO_FBK1. RBIAS may also be bootstrapped by another source of voltage. Filters 81 and level shifters may be connected between the RBIAS and VCO_FBK1 signals.

Figure 7:
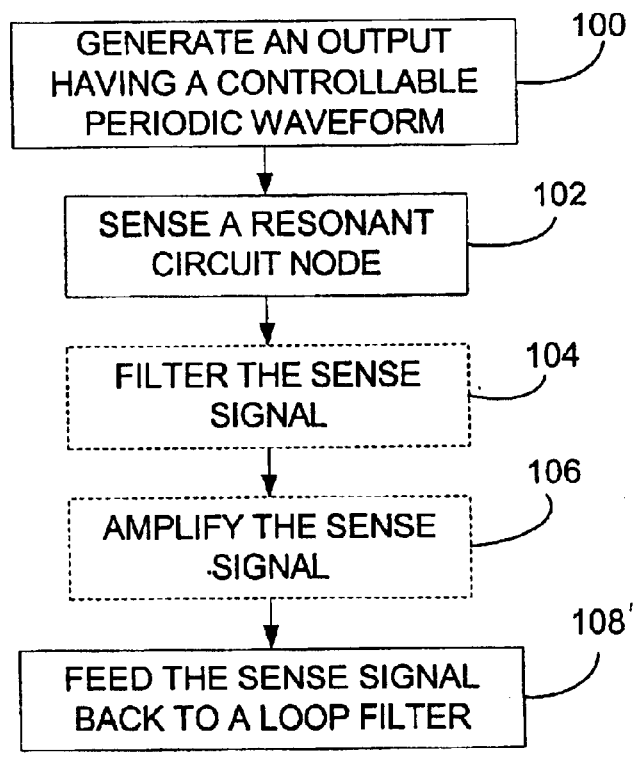
FIG. 7 is a flow chart of an operation for generating a signal having a periodic waveform.

FIG. 7 shows an operation for generating an output having a periodic waveform. Starting at block 100, an output having a controllable periodic waveform is generated by a VCO having a resonant circuit. Continuing to block 102, a node of the resonant circuit is sensed for an electrical signal such as voltage and current. The sensed electrical signal may be filtered, at block 104. At block 106, the sensed electrical signal may be amplified. Continuing to block 108, the sensed electrical signal is fed back to a loop filter to be combined with a phase error signal to generate a control voltage signal. The control voltage signal provides a control input for the VCO to adjust the periodic waveform.

A number of embodiments of the invention have been described. Nevertheless, it will be understood that various modifications may be made without departing from the spirit and scope of the invention. Accordingly, other embodiments are within the scope of the following claims.

What is claimed is:

1. A phase locked loop, comprising:
a loop filter having a first input to receive a detected signal from a detector and a second input to receive a second input signal, and to generate a control voltage as a function of the detected signal and the second input signal;
a voltage controlled oscillator (VCO) including a varactor and to provide a feedback signal, the VCO, in response to the control voltage, to generate a periodic output signal having a frequency at an output of the phase locked loop, the feedback signal including a noise component from the VCO;
and the control voltage responsive to the noise component included in the feedback signal so that noise in the periodic output signal is reduced.

2. The phase locked loop of claim 1 wherein the loop filter second input to receive the feedback signal.

3. The phase locked loop of claim 1 wherein the noise component appears on the varactor; and
the loop filter second input to receive the feedback signal.

4. The phase locked loop of claim 1 wherein the loop filter is selected from a group consisting of a passive filter and an active filter.

5. The phase locked loop of claim 1 wherein the loop filter is selected from a group consisting of a low pass filter, a lead-lag filter, and higher order filters.

6. The phase locked loop of claim 1 further comprising a charge pump to generate the detected signal as a function of a phase error signal; and
a phase detector to generate the phase error signal as a function of comparing a reference clock signal to a feedback clock signal;
wherein the feedback clock signal is a function of the periodic output signal.

7. The phase locked loop of claim 6 further comprising a frequency divider to generate the feedback clock signal based on the periodic output signal.

8. The phase locked loop of claim 1 further comprising a low pass filter to filter the feedback signal.

9. The phase locked loop of claim 8 wherein the phase locked loop has a natural frequency; and
the low pass filter has a corner frequency between the phase locked loop natural frequency and the frequency of the periodic output signal, the low pass filter to attenuate frequency components in the feedback signal that are at least equal to the corner frequency.

10. A phase locked loop, comprising:
a loop filter having a first input to receive a detected signal from a detector and a second input to receive a second input signal, and to generate a control voltage as a function of the detected signal and the second input signal;
a voltage controlled oscillator (VCO) including a varactor and to provide a feedback signal, the VCO, in response to the control voltage, to generate a periodic output signal having a frequency at an output of the phase locked loop, the feedback signal including a noise component from the VCO; and
the control voltage responsive to the noise component included in the feedback signal so that noise in the periodic output signal is reduced;
wherein the VCO includes an inductor connected to a negative resistance and the varactor; and
wherein the feedback signal is communicated from the inductor to the second input of the loop filter.

11. The phase locked loop of claim 10 wherein the inductor includes at least two inductors having a center-tap; and
the feedback signal is communicated from the center-tap of the at least two inductors.

12. A phase locked loop, comprising:
a loop filter having a first input to receive a detected signal from a detector and a second input to receive a second input signal, and to generate a control voltage as a function of the detected signal and the second input signal;
a voltage controlled oscillator (VCO) including a varactor and to provide a feedback signal, the VCO, in response to the control voltage, to generate a periodic output signal having a frequency at an output of the phase locked loop, the feedback signal including a noise component from the VCO; and
the control voltage responsive to the noise component included in the feedback signal so that noise in the periodic output signal is reduced;
wherein the VCO includes a bias signal to bootstrap the varactor from a source of voltage in the VCO.

13. A phase locked loop, comprising:
means for filtering having a first input to receive a detected signal from a detector and a second input to receive a second input signal, and to generate a control voltage as a function of the detected signal and the second input signal; and
means for generating a periodic output signal having a frequency at an output of the phase locked loop and to generate the periodic output signal in response to the control voltage, the generating means including a varactor and a feedback signal, the feedback signal including a noise component from the generating means; and
wherein the control voltage responsive to the noise component included in the feedback signal so that noise in the periodic output signal is reduced.

14. The phase locked loop of claim 13 wherein the filtering means second input to receive the feedback signal.

15. The phase locked loop of claim 13 wherein the noise component appears on the varactor; and
the filtering means second input to receive the feedback signal.

16. The phase locked loop of claim 13 wherein the loop filter is selected from a group consisting of a passive filter and an active filter.

17. The phase locked loop of claim 13 wherein the loop filter is selected from a group consisting of a low pass filter, a lead-lag filter, and higher order filters.

18. The phase locked loop of claim 13 further comprising means for converting charge to generate the detected signal as a function of a phase error signal; and
means for phase detecting to generate the phase error signal as a function of comparing a reference clock signal to a feedback clock signal;
wherein the feedback clock signal is a function of the periodic output signal.

19. The phase locked loop of claim 18 further comprising means for dividing frequency to generate the feedback clock signal based on the periodic output signal.

20. The phase locked loop of claim 13 further comprising means for low pass filtering to filter the feedback signal.

21. The phase locked loop of claim 20 wherein the phase locked loop has a natural frequency; and
the low pass filtering means has a corner frequency between the phase locked loop natural frequency and the frequency of the periodic output signal, the low pass filter to attenuate frequency components in the feedback signal that are at least equal to the corner frequency.

22. A phase locked loop, comprising:
means for filtering having a first input to receive a detected signal from a detector and a second input to receive a second input signal, and to generate a control voltage as a function of the detected signal and the second input signal; and
means for generating a periodic output signal having a frequency at an output of the phase locked loop and to generate the periodic output signal in response to the control voltage, the generating means including a varactor and a feedback signal, the feedback signal including a noise component from the generating means;
wherein the control voltage responsive to the noise component included in the feedback signal so that noise in the periodic output signal is reduced;
wherein the periodic output signal generating means includes an inductor connected to a negative resistance and the varactor; and
wherein the feedback signal is communicated from the inductor to the second input of the filtering means.

23. The phase locked loop of claim 22 wherein the inductor includes at least two inductors having a center-tap; and
the feedback signal is communicated from the center-tap of the at least two inductors.

24. A phase locked loop, comprising:
means for filtering having a first input to receive a detected signal from a detector and a second input to receive a second input signal, and to generate a control voltage as a function of the detected signal and the second input signal; and
means for generating a periodic output signal having a frequency at an output of the phase locked loop and to generate the periodic output signal in response to the control voltage, the generating means including a varactor and a feedback signal, the feedback signal including a noise component from the generating means;
wherein the control voltage responsive to the noise component included in the feedback signal so that noise in the periodic output signal is reduced; and
wherein the periodic output signal generating means includes means for bootstrapping a bias signal from the feedback signal to the varactor to bias the periodic output signal generating means.

25. A method of generating a periodic output signal having a frequency, comprising:
providing a voltage controlled oscillator (VCO) including a varactor, the VCO to generate the periodic output signal at an output;
comparing a detected signal from a detector to a second input signal on a second input;
generating a control voltage as a function of the comparing;
in response to the control voltage, controlling the VCO to generate the periodic output signal at an output;
generating a feedback signal having a noise component from the VCO; and
controlling the control voltage in response to the noise component included in the feedback signal so that noise in the periodic output signal is reduced.

26. The method of claim 25 wherein comparing includes comparing the detected input to the feedback signal.

27. The method of claim 25 further comprising communicating the feedback signal from the varactor to the second input.

28. The method of claim 25 wherein comparing includes filtering the detected signal.

29. The method of claim 28 wherein filtering the detected signal includes applying a loop filter selected from a group consisting of a low pass filter, a lead-lag filter, and higher order filters.

30. The method of claim 25 further comprising generating the detected signal as a function of a phase error signal; and
generating the phase error signal as a function of comparing a reference clock signal to a feedback clock signal.

31. The method of claim 30 further comprising generating the feedback clock signal based on the periodic output signal.

32. The method of claim 25 further comprising filtering the feedback signal.

33. The method of claim 32 wherein filtering the feedback signal includes applying a low pass filter having a corner frequency between the phase lock loop natural frequency and the output signal frequency, the low pass filter to attenuate frequency components in the feedback signal that are at least equal to the corner frequency.

34. A method of generating a periodic output signal having a frequency, comprising:
providing a voltage controlled oscillator (VCO) including a varactor, the VCO to generate the periodic output signal at an output;
comparing a detected signal from a detector to a second input signal on a second input;
generating a control voltage as a function of the comparing;
in response to the control voltage, controlling the VCO to generate the periodic output signal at an output;
generating a feedback signal having a noise component from the VCO; and
controlling the control voltage in response to the noise component included in the feedback signal so that noise in the periodic output signal is reduced;
wherein providing the VCO includes an inductor connected to a negative resistance and the varactor; and
communicating the second input signal from the inductor.

35. The method of claim 34 wherein the inductor includes at least two inductors having a center-tap; and
communicating the second input signal from the center-tap of the at least two inductors.

36. A method of generating a periodic output signal having a frequency, comprising:
providing a voltage controlled oscillator (VCO) including a varactor, the VCO to generate the periodic output signal at an output;
comparing a detected signal from a detector to a second input signal on a second input;
generating a control voltage as a function of the comparing;
in response to the control voltage, controlling the VCO to generate the periodic output signal at an output;
generating a feedback signal having a noise component from the VCO; and
controlling the control voltage in response to the noise component included in the feedback signal so that noise in the periodic output signal is reduced;

further comprising bootstrapping a bias signal from the feedback signal to the varactor to bias the VCO.

37. The method of claim 36 further comprising filtering the bias signal.

38. A phase locked loop, comprising:
a loop filter having a first input to receive a detected signal from a detector and a second input to receive a feedback signal, and to generate a control voltage as a function of the detected signal and the feedback signal;
a voltage controlled oscillator (VCO) including a feedback output to provide the feedback signal and a varactor, the VCO, in response to the control voltage, to generate a periodic output signal having a frequency at an output of the phase locked loop; and
the control voltage responsive to the feedback signal so that noise in the periodic output signal is reduced.

39. A phase locked loop, comprising:
means for filtering having a first input to receive a detected signal from a detector and a second input to receive a feedback signal, and to generate a control voltage as a function of the detected signal and the feedback signal; and
means for generating a periodic output signal having a frequency at an output of the phase locked loop, the generating means including a varactor, the generating means to generate the periodic output signal in response to the control voltage; and
wherein the control voltage responsive to the feedback signal so that noise in the periodic output signal is reduced.

40. A method of generating a periodic output signal having a frequency, comprising:
providing a voltage controlled oscillator (VCO) including a varactor, the VCO to generate the periodic output signal on an output;
communicating a feedback signal from the VCO;
comparing a detected signal to the feedback signal;
generating a control voltage as a function of the comparing; and
to generate the periodic output signal, controlling the VCO in response to the control voltage so that noise in the periodic output signal is reduced.

41. A phase locked loop, comprising:
a loop filter having a first input to receive a detected signal from a detector and a second input to receive a second input signal, and to generate a control voltage as a function of the detected signal and the second input signal;
a voltage controlled oscillator (VCO) sourcing a feedback signal and including a varactor, the VCO, in response to the control voltage, to generate a periodic output signal having a frequency at the output of the phase locked loop, and
the feedback signal to include a noise component from the VCO, the feedback signal to bootstrap the noise component to the varactor through the control voltage so that noise in the periodic output signal is reduced.

42. A phase locked loop, comprising:
means for filtering having a first input to receive a detected signal from a detector and a second input to receive a second input signal, and to generate a control voltage as a function of the detected signal and the second input signal; and
means for generating a periodic output signal having a frequency at an output of the phase locked loop, the generating means sourcing a feedback signal and including a varactor, the generating means to generate the periodic output signal in response to the control voltage; and
the feedback signal to include a noise component from the generating means, the feedback signal to bootstrap the noise component to the varactor through the control voltage so that noise in the periodic output signal is reduced.

43. A method of generating a periodic output signal having a frequency, comprising:
providing a voltage controlled oscillator (VCO) to source a feedback signal and including a varactor, the feedback signal including a noise component from the VCO;
using the VCO to generate the periodic output signal;
comparing a detected signal to a second input signal;
generating a control voltage as a function of the comparing;
in response to the control voltage, controlling the VCO to generate the periodic output signal; and
bootstrapping the feedback signal to the varactor through the control voltage so that noise in the periodic output signal is reduced.

* * * * *